(12) United States Patent
Fujimoto

(10) Patent No.: US 6,449,196 B2
(45) Date of Patent: Sep. 10, 2002

(54) BUS DRIVING CIRCUIT AND MEMORY DEVICE HAVING SAME

(75) Inventor: Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/910,602

(22) Filed: Jul. 20, 2001

Related U.S. Application Data

(62) Division of application No. 09/498,168, filed on Feb. 4, 2000, now Pat. No. 6,301,160.

(30) Foreign Application Priority Data

Feb. 9, 1999 (JP) .............................................. 11-31811

(51) Int. Cl.[7] .................................................. G11C 7/00
(52) U.S. Cl. ............. 365/189.05; 365/203; 365/189.01; 365/191
(58) Field of Search ....................... 365/189.01, 230.01, 365/189.05, 191, 203, 204

(56) References Cited

U.S. PATENT DOCUMENTS

| | | | | |
|---|---|---|---|---|
| 4,500,988 A | * | 2/1985 | Bennett et al. ................ 370/85 |
| 4,899,066 A | * | 2/1990 | Aikawa et al. ............ 307/45.2 |
| 5,295,104 A | * | 3/1994 | McClure ..................... 365/210 |
| 5,402,388 A | * | 3/1995 | Wojcicki et al. ............. 365/233 |
| 5,502,684 A | * | 3/1996 | Koshikawa ............ 365/230.06 |
| 5,511,170 A | * | 4/1996 | Abdoo ...................... 395/280 |
| 5,572,687 A | * | 11/1996 | Alnuweiri ................... 395/303 |
| 5,611,045 A | * | 3/1997 | Basile ................... 395/184.01 |
| 5,661,417 A | * | 8/1997 | Kondoh ........................ 326/87 |
| 5,668,482 A | * | 9/1997 | Roskell ........................ 326/31 |
| 5,748,556 A | * | 5/1998 | Iyengar .................. 365/230.06 |
| 5,809,227 A | * | 9/1998 | Basile .................... 395/184.01 |
| 5,835,449 A | * | 11/1998 | Lee ............................ 365/238.5 |
| 5,966,319 A | * | 10/1999 | Sato ............................ 365/154 |
| 5,982,674 A | * | 11/1999 | Lines et al. ............. 365/189.02 |
| 6,097,209 A | * | 8/2000 | Fujimoto ....................... 326/27 |
| 6,301,160 B1 | * | 10/2001 | Fujimoto ............... 365/189.05 |

FOREIGN PATENT DOCUMENTS

| JP | 404007618 A | * | 1/1992 |
| JP | 405028107 A | * | 2/1993 |
| JP | 407028715 A | * | 1/1995 |
| JP | 410289593 A | * | 10/1998 |
| JP | 411073775 A | * | 3/1999 |
| JP | 02000231426 | * | 8/2000 |

* cited by examiner

Primary Examiner—Viet Q. Nguyen
(74) Attorney, Agent, or Firm—Hogan & Hartson, L.L.P.

(57) ABSTRACT

A memory unit includes a plurality of memory cells arranged in the form of a matrix; word lines for selecting memory cells on the same line; bit lines for transmitting the potential levels of the memory cells selected by the word lines; a bit line pre-charge circuit for pre-charging the bit lines; a sense amplifier circuit for amplifying the potentials of the memory cells which are read to the bit lines; a bus pre-charge means for pre-charging a bus line on the basis of a pre-charge signal produced in synchronism with a clock signal; a tristate buffer for driving the bus line on the basis of a gate control signal; and a gate control circuit for transmitting the gate control signal to the tristate buffer so as not to drive the bus line when an enable signal is in an inactive state, and for transmitting the gate control signal to the tristate buffer so as to drive the bus line on the basis of the potential of the bus line and the output data of the sense amplifier circuit when the enable signal is in an active state.

6 Claims, 7 Drawing Sheets

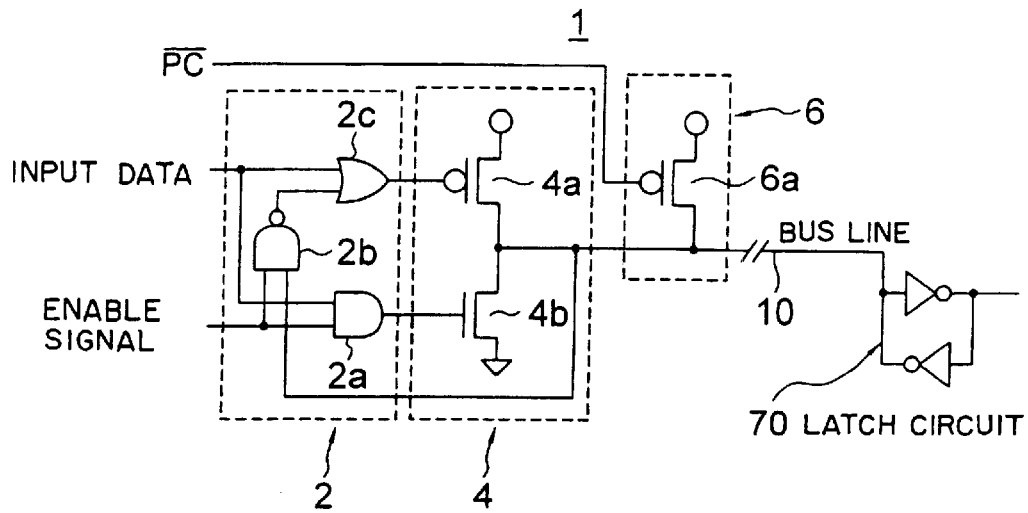
F I G. 1
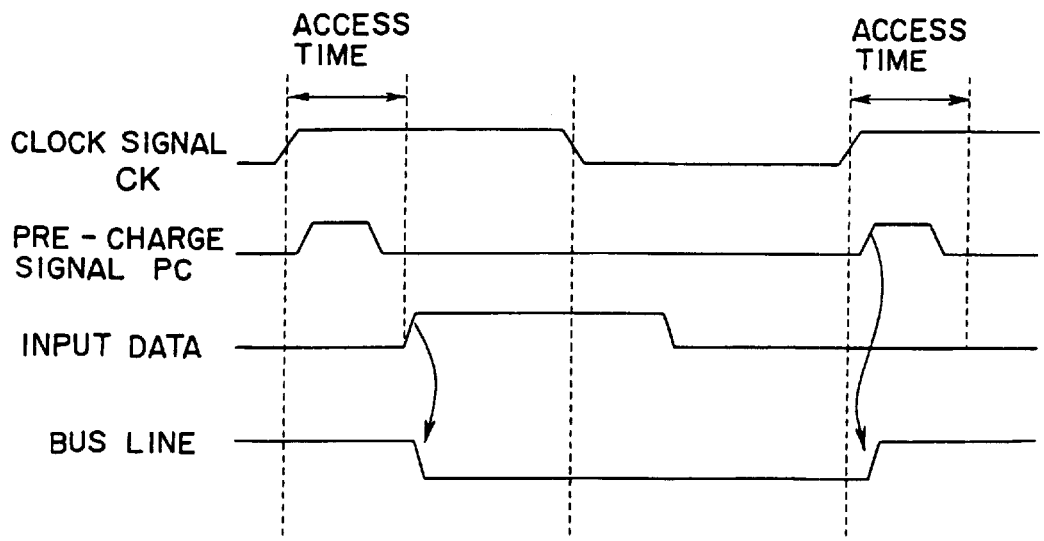
F I G. 2

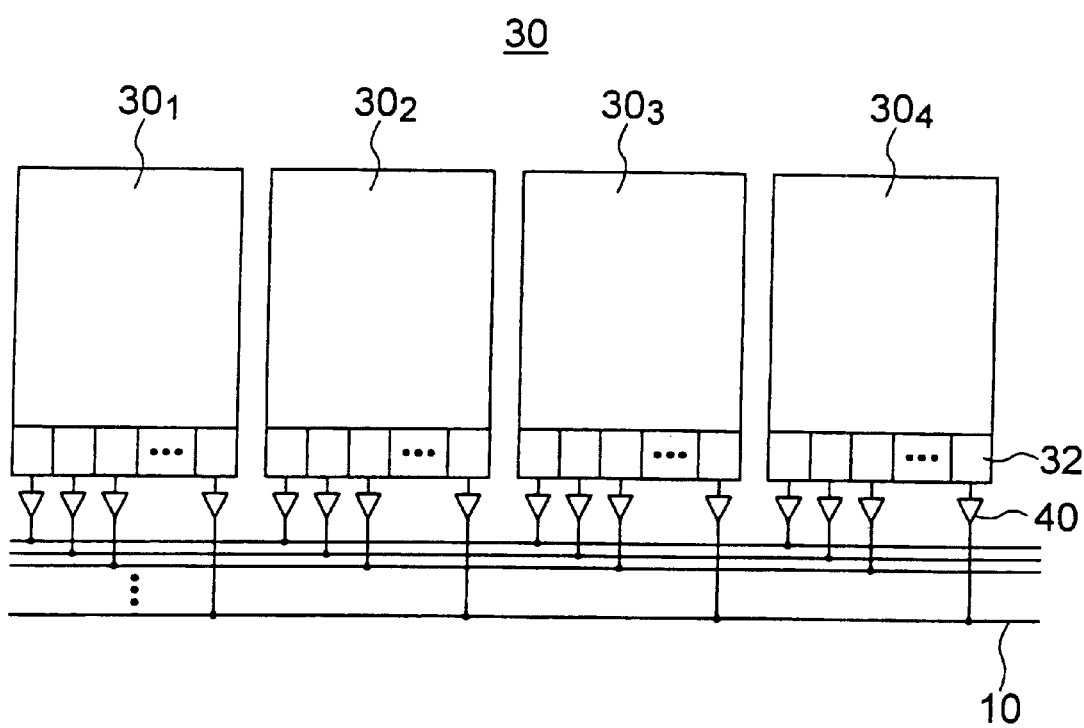
F I G. 3

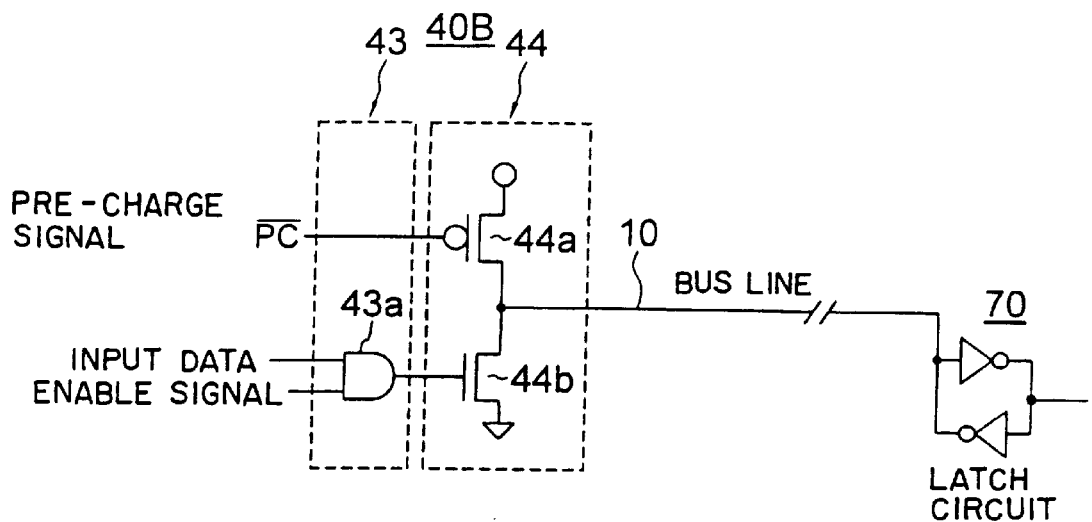
F I G. 6
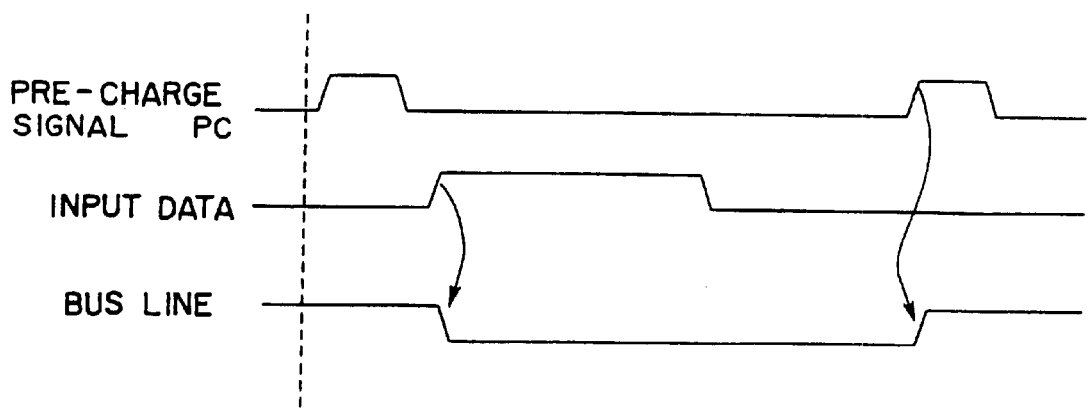
F I G. 7

BUS DRIVING CIRCUIT AND MEMORY DEVICE HAVING SAME

This application is a division of application Ser. No. 09/498,168 filed Feb. 4, 2000, now U.S. Pat. No. 6,301,160.

BACKGROUND OF THE INVENTION

1. Field of the Invention

The present invention relates generally to a bus driving circuit for driving a bus line provided in a large scale integrated circuit. More specifically, the invention relates to a bus driving circuit used for transferring output data from a pre-charge type circuit via a bus line.

2. Description of the Prior Art

In recent years, large scale integrated circuits (LSIs) are large-scaled and accelerated at a request for the advance of the fine patterning technology and the improvement of the system performance.

As microprocessors, LSIs having a plurality of circuit blocks therein have a bus line for connecting these circuit blocks.

For example, as shown in FIG. 3, a large memory unit 30 built in a microprocessor is separated into a plurality of memory blocks $30_1$, $30_2$, $30_3$ and $30_4$ by addresses. The data output terminals of these memory blocks are connected to a bus line 10 via a read circuit 32 and a bus driving circuit 40. Such a bus line 10 is driven by the bus driving circuit 40 of an activated one of the memory blocks to transfer data to the next stage circuit.

FIG. 4 shows a conventional bus driving circuit. This bus driving circuit 40A comprises: a tristate buffer 44 comprising a P-channel MOSFET 44a and an N-channel MOSFET 44b; and a gate control circuit 42 for controlling the gate of each of the MOSFETs of the tristate buffer 44 on the basis of an enable signal and input data.

The gate control circuit 42 comprises an AND gate 42a, an inverter 42b and an OR gate 42c. The AND gate 42a performs an AND operation on the basis of the enable signal and the input data to transmit the operated results to the gate of the N-channel MOSFET 44b. The OR gate 42c performs an OR operation on the basis of the input data and a signal produced by inverting the enable signal by the inverter 42b, to transmit the operated results to the gate of the P-channel MOSFET 44a. Furthermore, the input data are produced in synchronism with a clock signal. The output of the tristate buffer 44 is connected to the bus line 10.

The operation of the bus driving circuit 40A is as follows. When the enable signal is inactive, the output of the tristate buffer 44 has high impedance so as not to drive the bus line 10. At this time, if the bus driving circuit 40A is connected to one memory block of the memory unit 30 shown in FIG. 3, other memory blocks are activated, and other bus driving circuits connected to the activated memory blocks drive the bus line 10 to perform data transfer.

On the other hand, if the enable signal inputted to the bus driving circuit 40A is activated, the bus line 10 is driven in accordance with the input data to perform data transfer as shown in FIG. 5. Furthermore, as shown in FIG. 4, an inverter 50 and a latch circuit 60 controlled by a clock signal CK are provided on the next stage circuit side, to which data are transferred. The potential of the bus line 10 holds data until the next memory access is started (until the clock signal CK is raised next time) (see FIG. 5)

FIG. 6 shows another example of a conventional bus driving circuit. In a bus driving circuit 40B shown in FIG. 6, the gate control circuit 42 of the bus driving circuit 40A shown in FIG. 4 is replaced with a gate control circuit 43. The gate control circuit 43 comprises an AND gate 43a. The AND gate 43a performs an AND operation on the basis of input data and an enable signal to transmit the operated results to the gate of an N-channel MOSFET 44b of a tristate buffer 44. Furthermore, to the gate of a P-channel MOSFET 44a of the tristate buffer 44, an inverted signal /PC of a pre-charge signal PC synchronized with a clock signal is inputted.

The conventional bus driving circuit 40B shown in FIG. 6 is designed to receive, as data input, the output of a pre-charge type circuit, i.e., a circuit wherein its output is previously set at a low potential and wherein the data transition of the output occurs only when a high potential is outputted. Furthermore, a read circuit 32 for reading data from the memory unit 30 shown in FIG. 3 is a pre-charge type circuit.

Referring to FIG. 7, the operation of the bus driving circuit 40B, which is shown in FIG. 6 and which is applied to the memory unit 30, will be described below.

The bus driving circuit 40B turns the P-channel MOSFET 44a ON, in response to the pre-charge signal PC during a memory access, to previously set the bus line 10 at the high potential. Thereafter, although the MOSFET 44a is turned OFF, the bus line is held to be the high potential by a latch circuit 70. Furthermore, the latch circuit 70 is provided on the side of a circuit, to which data are transferred. In such a state, if the enable signal is activated and if high potential data are outputted from the read circuit 32 of the memory unit 30, the N-channel MOSFET 44b is turned ON, so that the bus line 10 is driven at a low potential to perform data transfer (see FIG. 7). The potential of the bus line 10 is held by the latch circuit 70 even after the memory access ends to set the output of the read circuit 32 at a low potential again until the next memory access is started to pre-charge the bus line 10 by the pre-charge signal /PC (see FIG. 7)

As described above, the potential of the bus line 10 connected to the conventional bus driving circuit 40B shown in FIG. 6 is held by the latch circuit 70 until the bus line 10 is pre-charged by the pre-charge signal /PC even after the memory access ends to set the output of the read circuit 32 at the low potential again. Therefore, since it is not required to provide the latch circuit 60 for operating in response to the clock signal, which is provided at the next stage of the bus line 10 as shown in FIG. 4, the number of gate stages can be smaller than that of the bus driving circuit 40A shown in FIG. 4, and the data transfer can be rapidly carried out.

However, the bus driving circuit shown in FIG. 6 is weak in noises since the bus line 10 remains being held at the high potential by the latch circuit 70 having a weak driving force when the output of the read circuit 32 has a low potential. In particular, the bus lines 10 are arranged in parallel at a long distance, and the data transitions occur simultaneously, so that there is much noise due to the coupling capacity with the next line.

Therefore, if the next bus line is driven at the low potential, there is some possibility that the potential of the bus line to be held at the high potential changes to the low potential under the influence of the coupling capacity to cause malfunction.

SUMMARY OF THE INVENTION

According to one aspect of the present invention, a memory unit includes a plurality of memory cells arranged in the form of a matrix: word lines for selecting memory cells on the same line; bit lines for transmitting the potential levels of the memory cells selected by the word lines; a bit line pre-charge circuit for pre-charging the bit lines; a sense amplifier circuit for amplifying the potentials of the memory cells which are read to the bit lines; bus pre-charge means for pre-charging a bus line on the basis of a pre-charge signal produced in synchronism with a clock signal; a tristate buffer for driving the bus line on the basis of a gate control signal; and a gate control circuit for transmitting the gate control signal to the tristate buffer so as not to drive the bus line when an enable signal is in an inactive state, and for transmitting the gate control signal to the tristate buffer so as to drive the bus line on the basis of the potential of the bus line the output data of the sense amplifier circuit when the enable signal is in an active state.

The gate control circuit may output first and second gate control signals, and the tristate buffer may include a first MOSFET of a first conductive type, which has a source connected to a first power supply, a gate for receiving the first gate control signal, and a drain connected to the bus line; and a second MOSFET of a second conductive type different from the first conductive type, the second MOSFET having a source connected to a second power supply for supplying a lower potential than that of the first power supply, a gate for receiving the second gate control signal, and a drain connected to the drain of the first MOSFET, the first MOSFET being turned ON only when the potential of the bus line is a logical value "H".

The bus pre-charge means may hold the input data on the bus line by pre-charging the bus line only during an access operation for the pre-charge circuit.

The first MOSFET may be a P-channel MOSFET, and the second MOSFET may be an N-channel MOSFET.

The gate control circuit may include an AND gate for performing an AND operation on the basis of the enable signal and the input data to output the second gate control signal; a NAND gate for performing a NAND operation on the basis of the enable signal and the potential of the bus line; and an OR gate for performing an OR operation on the basis of the input data and the output of the NAND gate to output the first gate control signal.

The bus pre-charge means may be a P-channel MOSFET.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a block diagram of a preferred embodiment of a bus driving circuit according to the present invention;

FIG. 2 is a timing chart for explaining the operation of the preferred embodiment shown in FIG. 1;

FIG. 3 is a block diagram of a memory unit;

FIG. 6 is a circuit diagram of another example of a conventional bus driving circuit;

FIG. 7 is a timing chart for explaining the operation of the bus driving circuit shown in FIG. 6;

DESCRIPTION OF THE PREFERRED EMBODIMENTS

Figure 4:
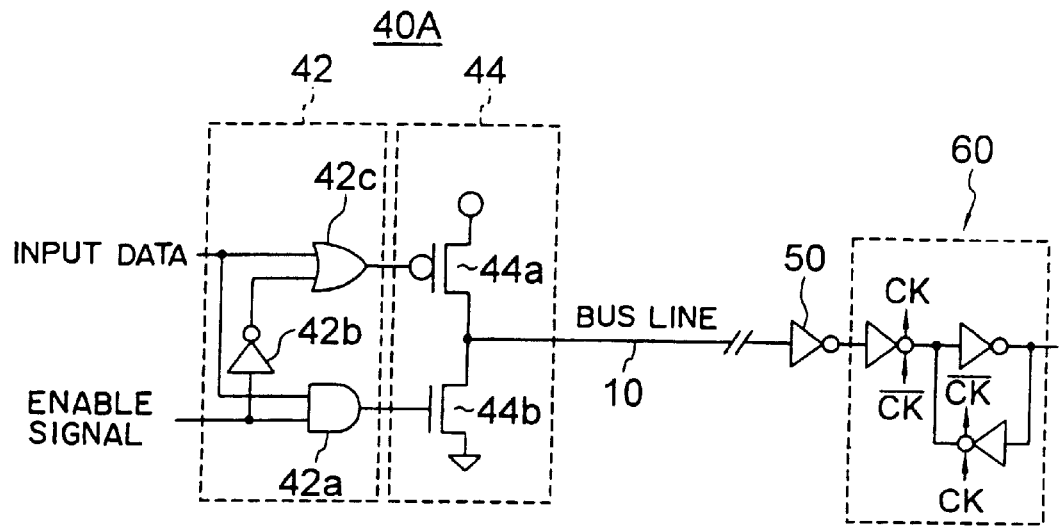
FIG. 4 is a circuit diagram of a conventional bus driving circuit.

FIG. 1 shows a preferred embodiment of a bus driving circuit according to the present invention. In this preferred embodiment, a bus driving circuit 1 is designed to transfer data, which are outputted from a pre-charge type circuit (e.g., a read circuit 32 of a memory unit 30 shown in FIG. 3), by driving a bus line 10. The bus driving circuit 1 comprises a gate control circuit 2, a tristate buffer 4, and a bus pre-charge means 6.

The tristate buffer 4 comprises a P-channel MOSFET 4a and an N-channel MOSFET 4b. The source of the MOSFET 4a is connected to a first power supply, and the drain thereof is connected to the drain of the MOSFET 4b and the bus line 10. The source of the MOSFET 4b is connected to a second power supply having a lower power supply potential than that of the first power supply.

The gate control circuit 2 is designed to drive the bus line 10 by controlling the gates of the MOSFETs 4a and 4b constituting the tristate buffer on the basis of input data, which are transmitted from the pre-charge type circuit, an enable signal and the potential of the bus line 10. The gate control circuit 2 comprises an AND gate 2a, a NAND gate 2b and an OR gate 2c. The AND gate 2a performs an AND operation on the basis of the input data and the enable signal to transmit the operated results to the gate of the N-channel MOSFET 4b of the tristate buffer 4. The NAND gate 2b performs a NAND operation on the basis of the enable signal and the potential of the bus line 10. The OR gate 2c performs an OR operation on the basis of the input data and the output of the NAND gate to transmit the operated results to the gate of the P-channel MOSFET of the tristate buffer 4.

The bus pre-charge means 6 comprises a P-channel MOSFET 6a. The source of the MOSFET 6a is connected to the first power supply, and the drain thereof is connected to the bus line 10. The gate of the MOSFET 6a receives an inverted signal /PC of a pre-charge signal PC. Furthermore, the pre-charge signal PC is activated in synchronism with a clock signal CK, and the pre-charge signal PC is inactive before the input data are transmitted to the bus driving circuit 1.

A latch circuit 70 is connected to the bus line 10. The latch circuit 70 is provided on the side of a circuit (not shown), to which data are transferred via the bus line 10.

Referring to FIG. 2, when the bus driving circuit 1 in this preferred embodiment receives, as input data, the output of the memory unit for reading data in synchronism with a clock signal, the operation of the bus driving circuit 1 will be described below.

The memory unit performs a memory access using a leading edge of a clock as a trigger, and the data output (i.e., the input data of the bus driving circuit 1) is previously set at an "L" level to perform a data transition in accordance with read data. After the data read ends, the data output is set at the "L" level again. Because the read circuit of a typical memory unit is a pre-charge type circuit which is operated using a pulse signal produced from a clock. Therefore, a waveform shown in FIG. 2 is given to the input of the bus driving circuit 1 from the memory unit.

The bus line 10 is set at an "H" level by the bus pre-charge means 6 during the data output (an access period) from the leading edge of a clock signal CK, at which a memory access is carried out (see FIG. 2). When the enable signal has the "L" level, the potentials of the "H" and "L" levels are applied to the MOSFETs 4a and 4b of the tristate buffer 4, respectively, so that the tristate buffer 4 does not drive the bus line 10. When the enable signal has the "H" level and when the bus driving circuit 1 is activated, an "L" level signal is inputted to the gate terminal of the N-channel MOSFET 4b since the input data has the "L" level, and an "L" level signal is inputted to the gate terminal of the P-channel MOSFET 4a since the potential of the bus line 10 has the "H" level and since the input data have the "L" level. Thus, the bus driving circuit 1 drives the bus line 10 at the "H" level (see FIG. 2)

Then, when the bus pre-charge means 6 is deactivated and when a memory access is carried out to apply the "H" level to the input signal (input data) of the bus driving circuit 1, both of the gate terminals of the P-channel MOSFET 4a and N-channel MOSFET 4b of the tristate buffer 4 have the "H" level, so that the bus line 10 is driven at the "L" level. At this time, since the data bus line 10 has the "L" level, the "H" level is applied to the gate terminal of the P-channel MOSFET 4a of the tristate buffer 4 regardless of the state of other signals. Therefore, after the memory access ends, when the data input level changes to the "L" level again, the "L" level of the bus line 10 is held by the latch circuit 70 while both of the N-channel MOSFET 4b and P-channel MOSFET 4a of the tristate buffer 4 are turned OFF. Data are held until the pre-charge of the bus line 10 is carried out after the next memory access is started, so that it is not required to provide the latch circuit 60 based on the clock as shown in FIG. 4. Thus, it is possible to reduce the number of gate stages, and it is possible to rapidly transfer data.

In addition, when the output of the memory circuit has the "L" level, the P-channel MOSFET 4a of the bus driving circuit 1 is in ON state to continuously drive the data bus at the "H" level, so that it is possible to prevent malfunction due to the coupling noises of the adjacent data bus lines.

Figure 8:
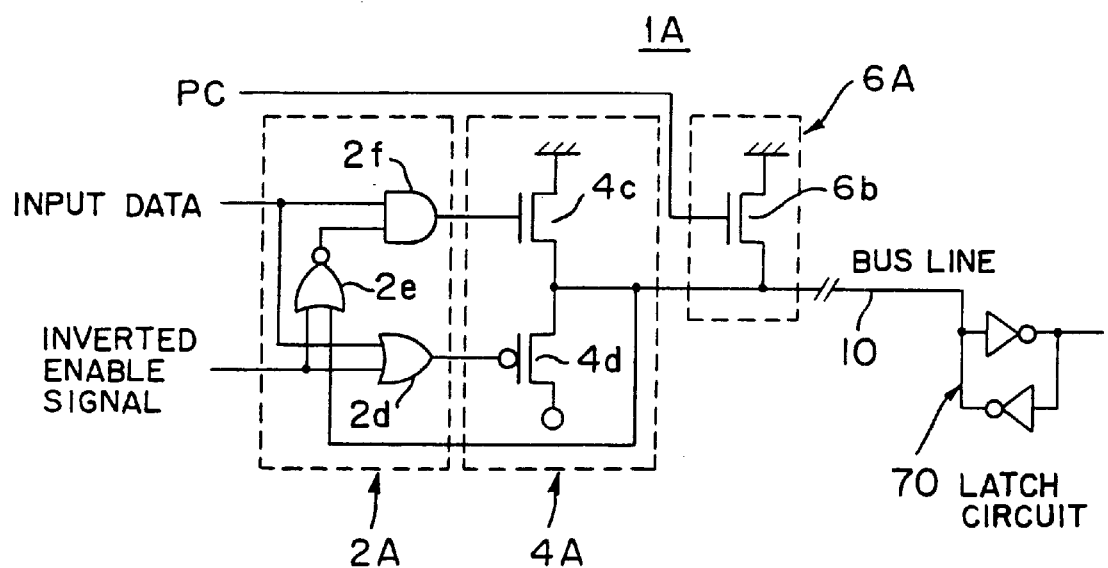
FIG. 8 is a block diagram of another preferred embodiment of a bus driving circuit according to the present invention.

Furthermore, while the bus line 10 has been pre-charged in the above described preferred embodiment, the bus line 10 may be discharged. FIG. 8 shows a bus driving circuit 1A in this case. The P-channel MOSFETs 4a and 6a shown in FIG. 1 are replaced with N-channel MOSFETs 4c and 6c, respectively. The N-channel MOSFET 4b, the AND gate 2a, the NAND gate 2b and the OR gate are replaced with a P-channel MOSFET 4d, a NOR gate 2d, a NOR gate 2e, and an AND gate 2f, respectively (see FIG. 8). In addition, the input data of the bus driving circuit are previously set at the "H" level.

Figure 9:
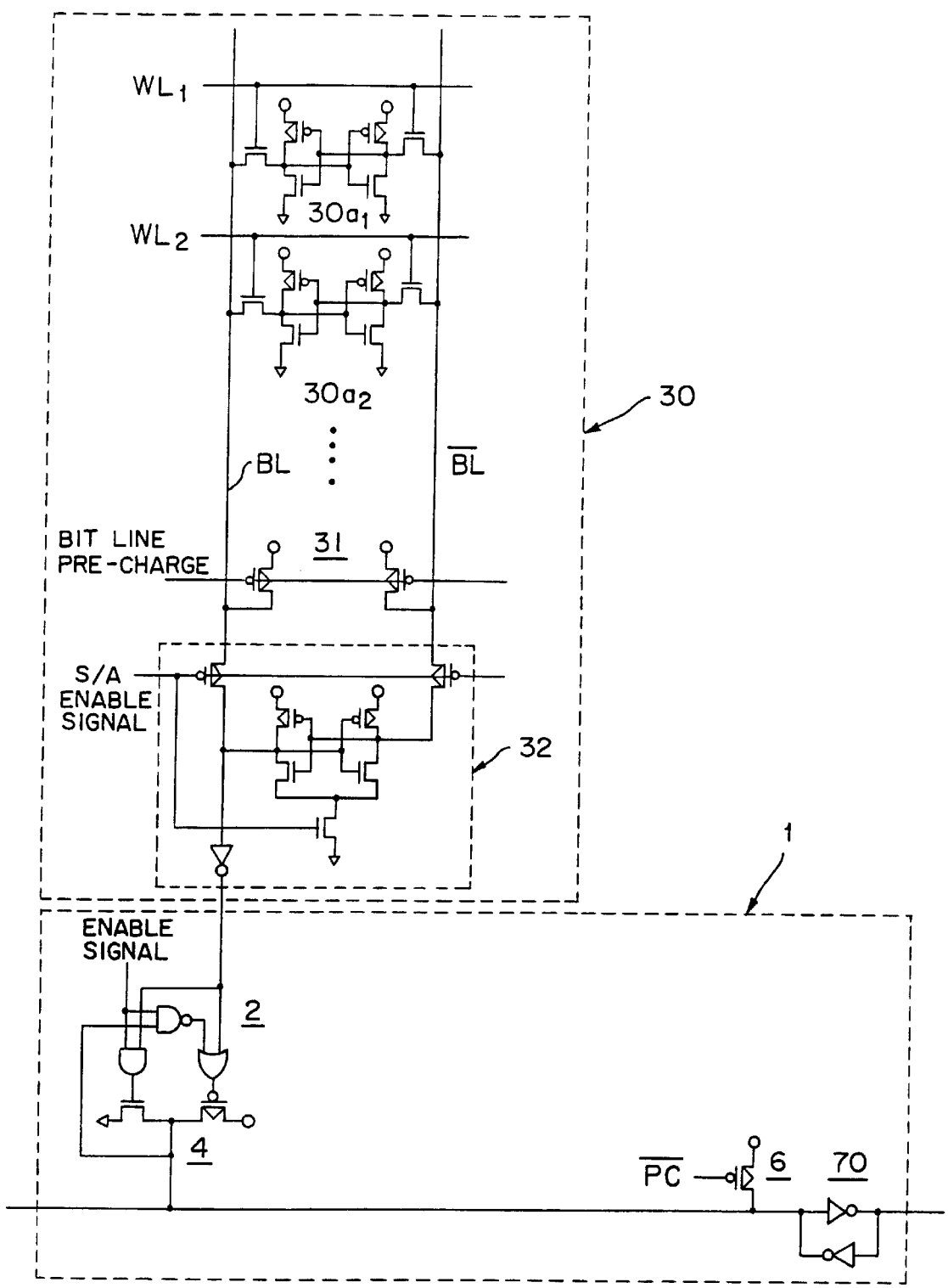
FIG. 9 is a block diagram of a preferred embodiment of a memory unit according to the present invention.
Figure 10:
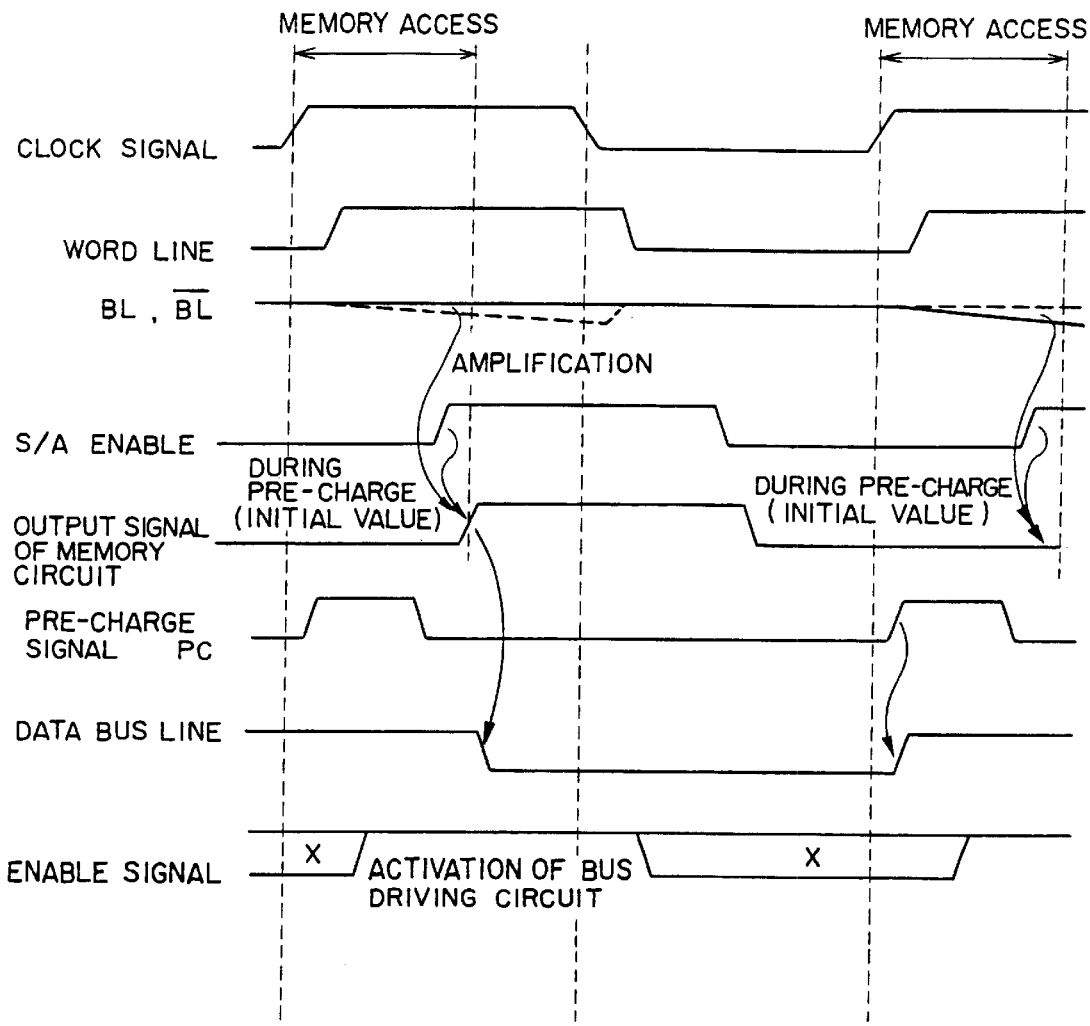
FIG. 10 is a timing chart for explaining the operation of the memory unit shown in FIG. 9.

Referring to FIGS. 9 and 10, a memory unit having the bus driving circuit in the preferred embodiment shown in FIG. 1 will be described below. FIG. 9 is a block diagram of the memory unit, and FIG. 10 is a timing chart showing the operation of the memory unit.

Figure 5:
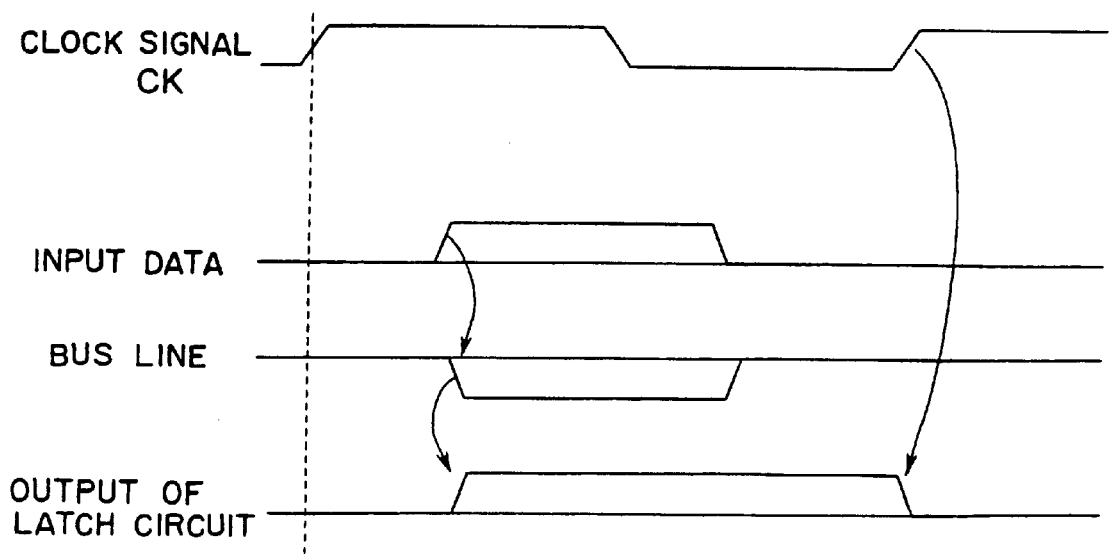
FIG. 5 is a timing chart for explaining the operation of the bus driving circuit shown in FIG. 4.

As shown in FIG. 5, the memory unit 30 comprises a plurality of memory cells $30a_1$, $30a_2$ arranged in the form of a matrix, word lines $WL_1$, $WL_2$ for selecting memory cells on the same line, a pair of bit lines BL, /BL for transmitting the potential levels of the memory cells selected by the word lines, a pre-charge circuit 31 for pre-charging the potentials of the pair of bit lines at the "H" level, and a sense amplifier circuit (which will be hereinafter referred to as an S/A circuit) 32 for amplifying the potentials of the memory cells which are read to the pair of bit lines. The output of the S/A circuit 32, i.e., the output of the memory unit 30, is supplied to the bus driving circuit 1 as input data.

Referring to FIG. 10, the operation of the memory unit 30 will be described below.

The potentials of the pair of bit lines BL, /BL are set at the "H" level by the pre-charge circuit 31. At this time, for example, if the word line $WL_1$ is activated, the pre-charge circuit 31 is turned OFF, and the memory cell holding data of the "L" level (e.g., the memory cell $30A_1$) drives the bit line BL or /BL so that the potential of the bit line BL is the "L" level. At this time, the data transition of the bit line BL or /BL is very slow since a small memory cell drives the bit line BL or /BL, to which a plurality of memory cells are connected and to which a heavy load is applied. Therefore, the S/A circuit 32 is used for amplifying the potential of the bit line.

The S/A circuit 32 amplifies the potential of the bit line BL or /BL in timing with the input of an S/A enable signal. After the word line is activated, the S/A enable signal is activated in a certain timing, so that the S/A circuit 32 amplifies the very small potentials of the pair of bit lines BL, /BL to a CMOS level potential to output data of the selected memory cell to the outside, i.e., to the bus driving circuit 1.

After the data are read, the S/A circuit 32 is deactivated, and the potentials of the pair of bit lines BL, /BL are precharged to the "H" level again by the pre-charge circuit 32 for the next read operation.

Thus, in order for the memory unit 30 to carry out a memory access (a data read operation) and a pre-charge operation in one clock cycle, a potential (an initial value) during the pre-charge operation is first outputted as the output data of the memory unit 30. Therefore, after the memory access, required data are outputted to the bus driving circuit 1, and the pre-charge operation is carried out by the pre-charge circuit 31 again, so that the initial value is outputted.

As described above, according to the present invention, it is possible to inhibit the influence of the coupling noises between bus lines, and it is possible to rapidly transfer data.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A memory unit comprising:
    a plurality of memory cells arranged in the form of a matrix;
    word lines for selecting memory cells on the same line;
    bit lines for transmitting the potential levels of the memory cells selected by said word lines;
    a bit line pre-charge circuit for pre-charging said bit
    a sense amplifier circuit for amplifying the potentials of the memory cells which are read to said bit lines;
    bus pre-charge means for pre-charging a bus line on the basis of a pre-charge signal produced in synchronism with a clock signal;
    a tristate buffer for driving said bus line on the basis of a gate control signal; and a gate control circuit for transmitting said gate control signal to said tristate buffer so as not to drive said bus line when an enable signal is in an inactive state, and for transmitting said gate control signal to said tristate buffer so as to drive said bus line on the basis of the potential of said bus line and the output data of said sense amplifier circuit when said enable signal is in an active state.

2. A memory unit as set forth in claim 1, wherein said gate control circuit outputs first and second gate control signals, and said tristate buffer comprises:

a first MOSFET of a first conductive type, which has a source connected to a first power supply, a gate for receiving said first gate control signal, and a drain connected to said bus line; and a second MOSFET of a second conductive type different from said first conductive type, said second MOSFET having a source connected to a second power supply for supplying a lower potential than that of said first power supply, a gate for receiving said second gate control signal, and a drain connected to said drain of said first MOSFET, said first MOSFET being turned ON only when the potential of said bus line is a logical value "H".

3. A memory unit as set forth in claim 1, wherein said bus pre-charge means holds said input data on said bus line by pre-charging said bus line only during an access operation for said pre-charge circuit.

4. A memory unit as set forth in claim 2, wherein said first MOSFET is a P-channel MOSFET, and said second MOSFET is an N-channel MOSFET.

5. A memory unit as set forth in claim 4, wherein said gate control circuit comprises: an AND gate for performing an AND operation on the basis of said enable signal and said input data to output said second gate control signal; a NAND gate for performing a NAND operation on the basis of said enable signal and the potential of said bus line; and an OR gate for performing an OR operation on the basis of said input data and the output of said NAND gate to output said first gate control signal.

6. A memory unit as set forth in claim 5, wherein said bus pre-charge means-is a P-channel MOSFET.

* * * * *